(12) United States Patent
Hosomi

(10) Patent No.: US 8,422,698 B2
(45) Date of Patent: Apr. 16, 2013

(54) SIGNAL PROCESSING APPARATUS AND METHOD, AND PROGRAM

(75) Inventor: Okifumi Hosomi, Kanagawa (JP)

(73) Assignee: Sony Corporation, Tokyo (JP)

( * ) Notice: Subject to any disclaimer, the term of this patent is extended or adjusted under 35 U.S.C. 154(b) by 376 days.

(21) Appl. No.: 12/707,267

(22) Filed: Feb. 17, 2010

(65) Prior Publication Data
US 2010/0254545 A1 Oct. 7, 2010

(30) Foreign Application Priority Data
Apr. 2, 2009 (JP) .................................. 2009-089748

(51) Int. Cl.
*H04B 15/00* (2006.01)
(52) U.S. Cl.
USPC ........... 381/94.4; 381/61; 381/106; 381/94.1; 381/94.5; 381/73.1; 381/56; 330/135; 330/305; 455/199.1; 455/242.1; 455/198.1; 455/63.1; 455/66.1
(58) Field of Classification Search ........... 381/61, 381/106, 94.4, 94.1, 94.5, 73.1, 56; 330/135, 330/305; 455/199.1, 242.1, 198.1, 63.1, 455/66.1, 67.11
See application file for complete search history.

(56) References Cited

U.S. PATENT DOCUMENTS

| | | | |
|---|---|---|---|
| 4,143,333 A * | 3/1979 | Jacobsen et al. ............... | 330/149 |
| 6,760,452 B2 * | 7/2004 | Lau et al. ....................... | 381/106 |
| 7,729,673 B2 * | 6/2010 | Romesburg et al. ......... | 455/199.1 |
| 7,949,419 B2 * | 5/2011 | Kong et al. ...................... | 700/94 |
| 8,005,230 B2 * | 8/2011 | Farinelli et al. .................. | 381/55 |
| 8,036,402 B2 * | 10/2011 | Furge ............................ | 381/120 |
| 8,103,018 B2 * | 1/2012 | Homma .......................... | 381/92 |
| 2003/0097257 A1 * | 5/2003 | Amada et al. ................. | 704/208 |
| 2003/0098805 A1 * | 5/2003 | Bizjak ........................... | 341/139 |
| 2004/0039464 A1 * | 2/2004 | Virolainen et al. ............. | 700/94 |
| 2005/0182996 A1 * | 8/2005 | Bruhn ........................... | 714/752 |
| 2008/0187153 A1 * | 8/2008 | Lin ............................... | 381/94.7 |
| 2009/0083031 A1 * | 3/2009 | Atlas et al. .................... | 704/219 |

FOREIGN PATENT DOCUMENTS

| | | | |
|---|---|---|---|
| JP | 53-30257 | | 3/1978 |
| JP | 60-202576 | | 10/1985 |
| JP | 2004045314 A | * | 2/2004 |
| JP | 2005204020 A | * | 7/2005 |
| JP | 2008236268 A | * | 10/2008 |

* cited by examiner

*Primary Examiner* — Davetta W Goins
*Assistant Examiner* — Kuassi Ganmavo
(74) *Attorney, Agent, or Firm* — Oblon, Spivak, McClelland, Maier & Neustadt, L.L.P.

(57) ABSTRACT

A signal processing apparatus includes: clip detector means that detects presence/absence of a clipped part with a deformed waveform in each of N audio signals output from N microphones (where N is an integer equal to or greater than 2) based on a dynamic range of a circuit; and interpolation means that treats an audio signal in the N audio signals which has the clipped part detected by the clip detector means as an interpolation target, and other audio signals as non-interpolation targets, and interpolates the waveform of the clipped part of the interpolation target using the waveform of at least one audio signal in the non-interpolation targets.

11 Claims, 16 Drawing Sheets

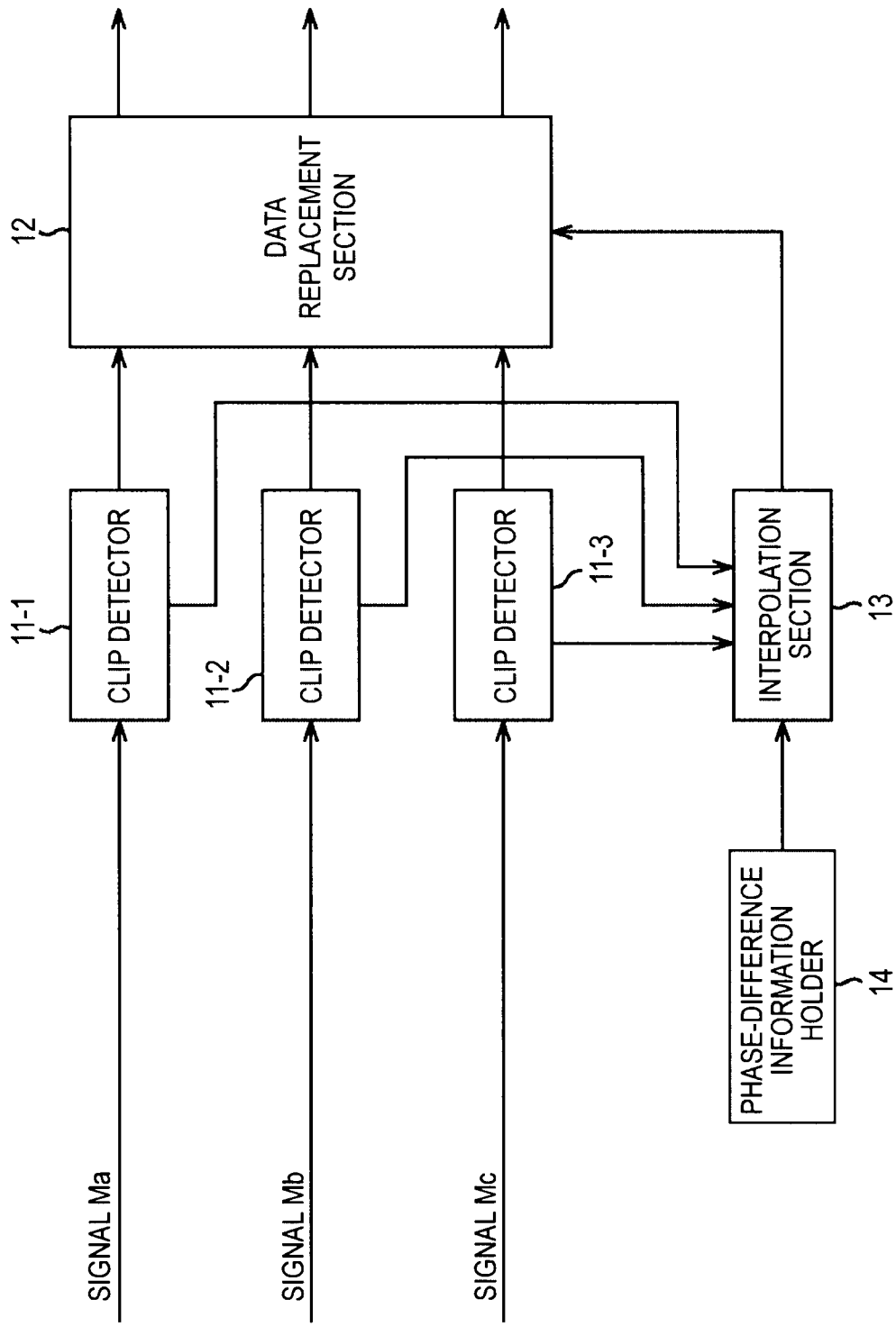

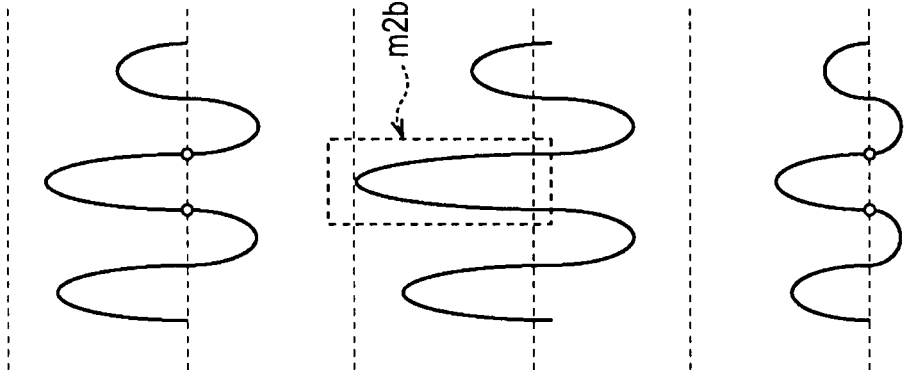
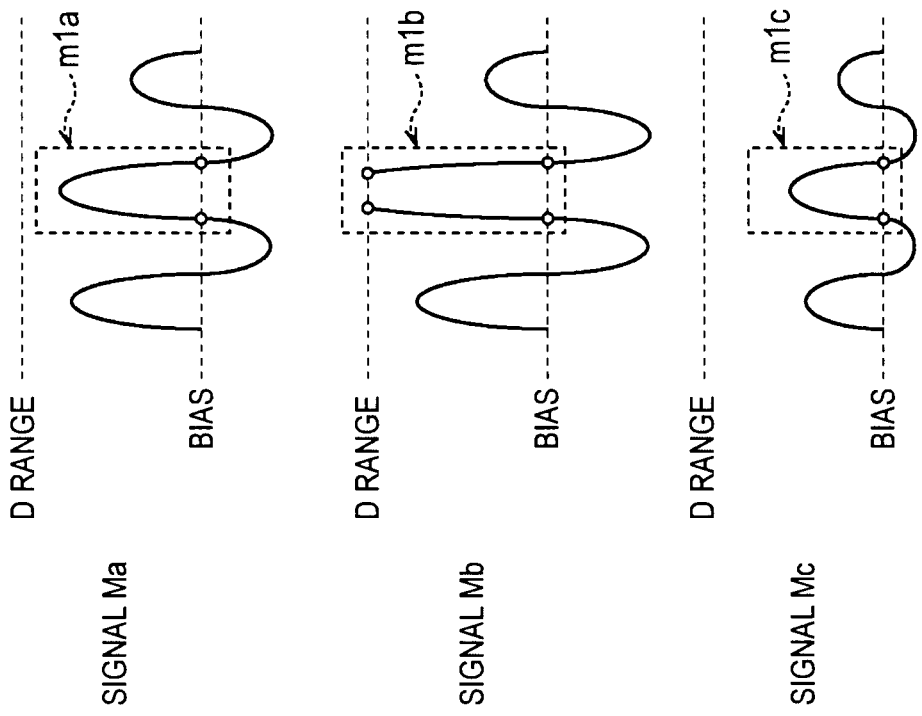

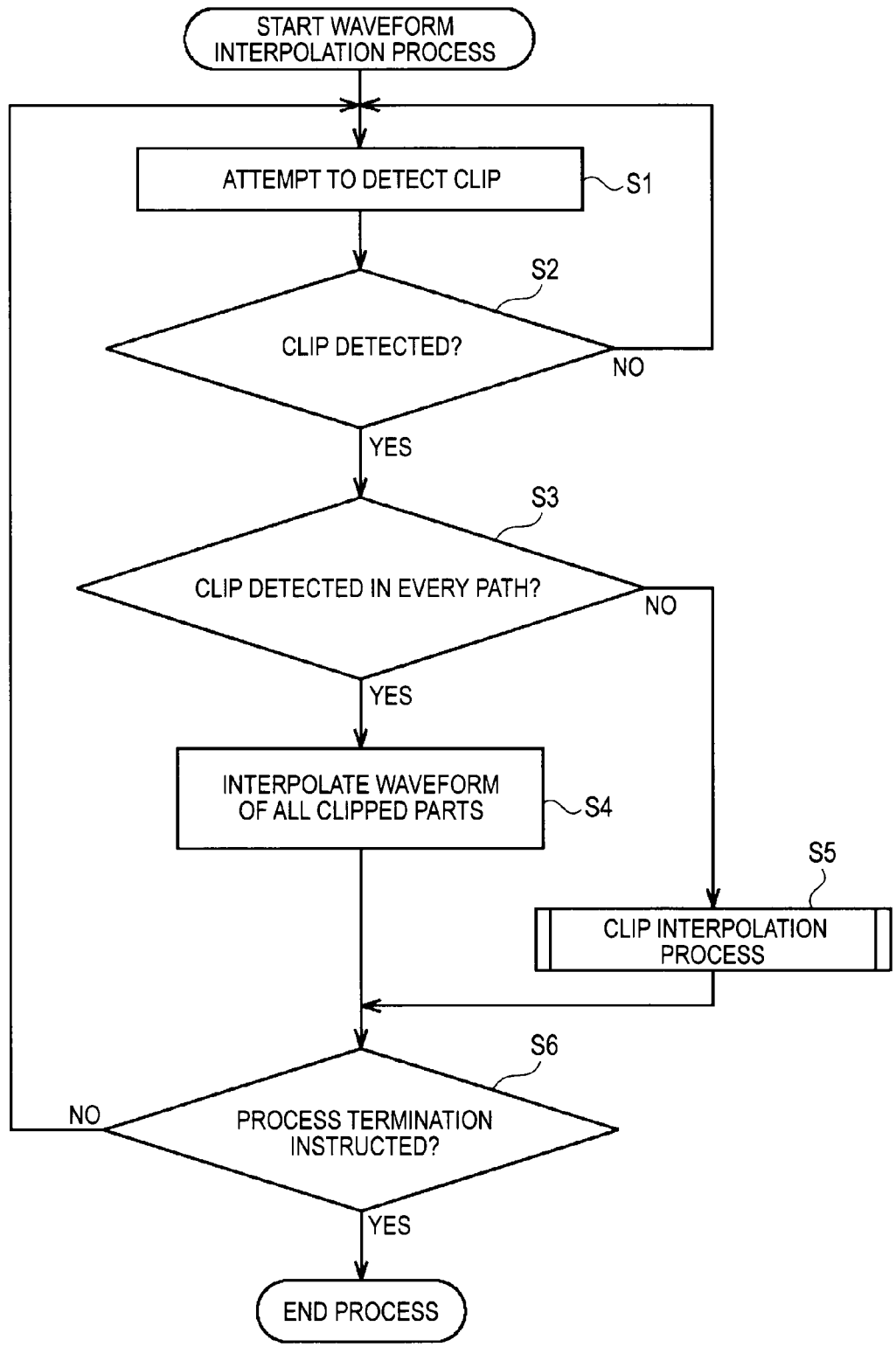

MATCHING WITH DYNAMIC RANGE

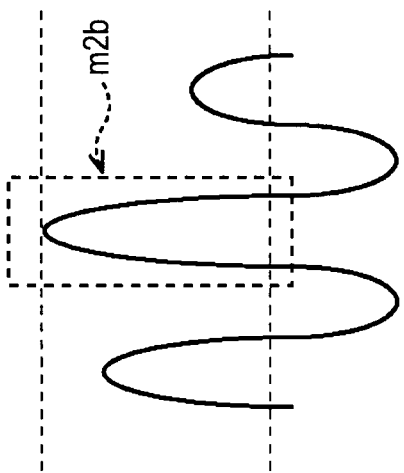
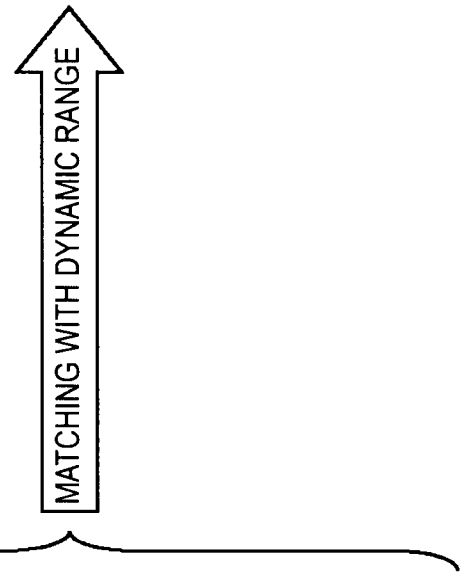
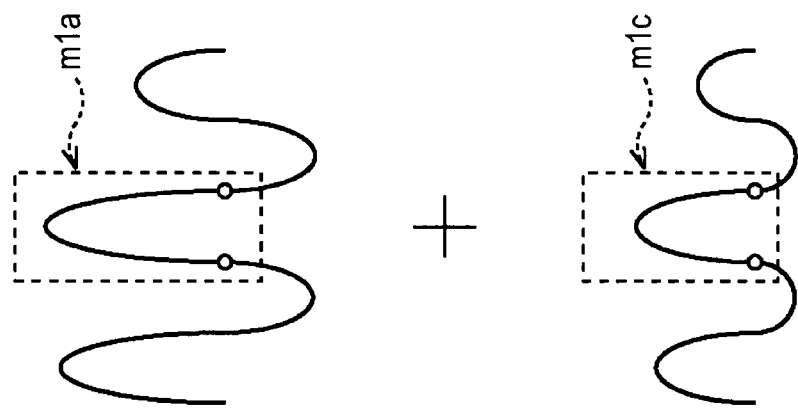

SIGNAL PROCESSING APPARATUS AND METHOD, AND PROGRAM

BACKGROUND OF THE INVENTION

1. Field of the Invention

The present invention relates to a signal processing apparatus and method, and a program, and, more particularly, to a signal processing apparatus and method, and a program, which can record and reproduce sounds with higher fidelity to original sounds.

2. Description of the Related Art

There is a sound recording apparatus which records environmental sounds input from a microphone. The waveform of an input audio signal to the sound recording apparatus may be deformed when it reaches the dynamic range of the circuit. There is a waveform interpolation scheme of interpolating the waveform of the deformed part (hereinafter referred to as "clipped part").

Japanese Patent No. 373156 (Patent Document 1), JP-A-60-202576 (Patent Document 2), and JP-A-53-30257 (Patent Document 3) disclose waveform interpolation schemes which cut out a clipped part when detected, and replaces the cut clipped part with a waveform newly created through computation.

SUMMARY OF THE INVENTION

However, because the waveform interpolation schemes according to the related arts including those disclosed in Patent Documents 1 to 3 newly create a waveform to be replaced through computation without considering the original waveform, the probability that the created waveform matches with the original waveform becomes lower. It is therefore very likely that sounds after waveform interpolation becomes different from the original sounds.

Accordingly, it is desirable to record and reproduce sounds with higher fidelity to original sounds.

According to an embodiment of the present invention, there is provided a signal processing apparatus including clip detector means that detects presence/absence of a clipped part with a deformed waveform in each of N audio signals output from N microphones (where N is an integer equal to or greater than 2) based on a dynamic range of a circuit, and interpolation means that treats an audio signal in the N audio signals which has the clipped part detected by the clip detector means as an interpolation target, and other audio signals as non-interpolation targets, and interpolates the waveform of the clipped part of the interpolation target using the waveform of at least one audio signal in the non-interpolation targets.

The interpolation means matches phases of the non-interpolation target to be used in interpolation and the interpolation target with each other, and interpolates the clipped part of the interpolation target using a waveform in that interval of the non-interpolation target to be used in interpolation, the waveform, corresponding to the clipped part of the interpolation target.

The signal processing apparatus may further include amplification/attenuation means that amplifies or attenuates the N audio signals output from the N microphones by a predetermined gain, wherein at least one of gains for the N audio signals is set to a value different from values of other gains.

N may be an integer equal to or greater than 3, and the interpolation means may interpolate a waveform of the clipped part of the interpolation target using waveforms of the non-interpolation targets.

An information processing method and a program according to another embodiment of the invention are compatible with the signal processing apparatus according to the embodiment of the invention.

According to the another embodiment of the invention, presence/absence of a clipped part with a deformed waveform in each of N audio signals output from N microphones (where N is an integer equal to or greater than 2) is detected based on a dynamic range of a circuit, an audio signal in the N audio signals which has the clipped part detected is treated as an interpolation target, other audio signals are treated as non-interpolation targets, and the waveform of the clipped part of the interpolation target is interpolated using the waveform of at least one audio signal in the non-interpolation targets.

According to the embodiments of the invention, it is possible to record and reproduce sounds with higher fidelity to original sounds.

BRIEF DESCRIPTION OF THE DRAWINGS

FIG. 5 is a block diagram showing a configurational example of a signal processing apparatus having three input paths as a third embodiment of the signal processing apparatus to which the invention is applied;

FIGS. 6A and 6B are diagrams showing the result of the waveform interpolation process of the signal processing apparatus in the example in FIG. 5;

FIG. 7 is a flowchart illustrating one example of the waveform interpolation process of the signal processing apparatus in the example in FIG. 5;

FIGS. 13A and 13B are exemplary diagrams for explaining a third example of the clip interpolation process for the example in FIGS. 6A and 6B;

DETAILED DESCRIPTION OF THE INVENTION

First to fifth embodiments of a signal processing apparatus to which the present invention is applied will be described below with reference to the accompanying drawings. The description will be given in the following order.

1. First Embodiment (first example having two inputs)
2. Second Embodiment (second example having two inputs)
3. Third Embodiment (example having three inputs)
4. Fourth Embodiment (third example having two inputs)
5. Fifth Embodiment (example with multi-inputs)

<1. First Embodiment>
[Configurational Example of First Embodiment]

Figure 1:
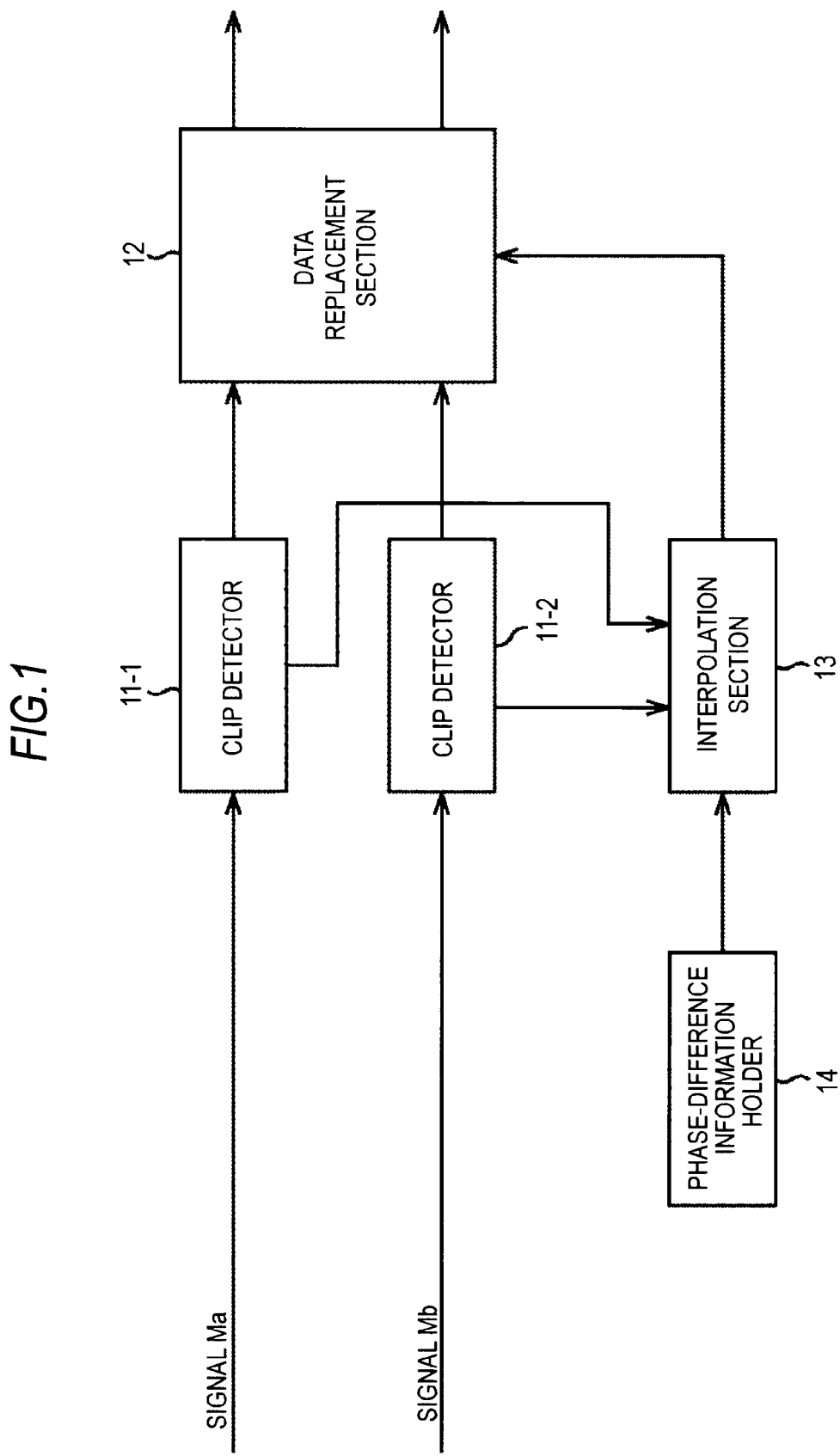
FIG. 1 is a block diagram showing a configurational example of a first embodiment of a signal processing apparatus to which the invention is applied.
Figure 2:
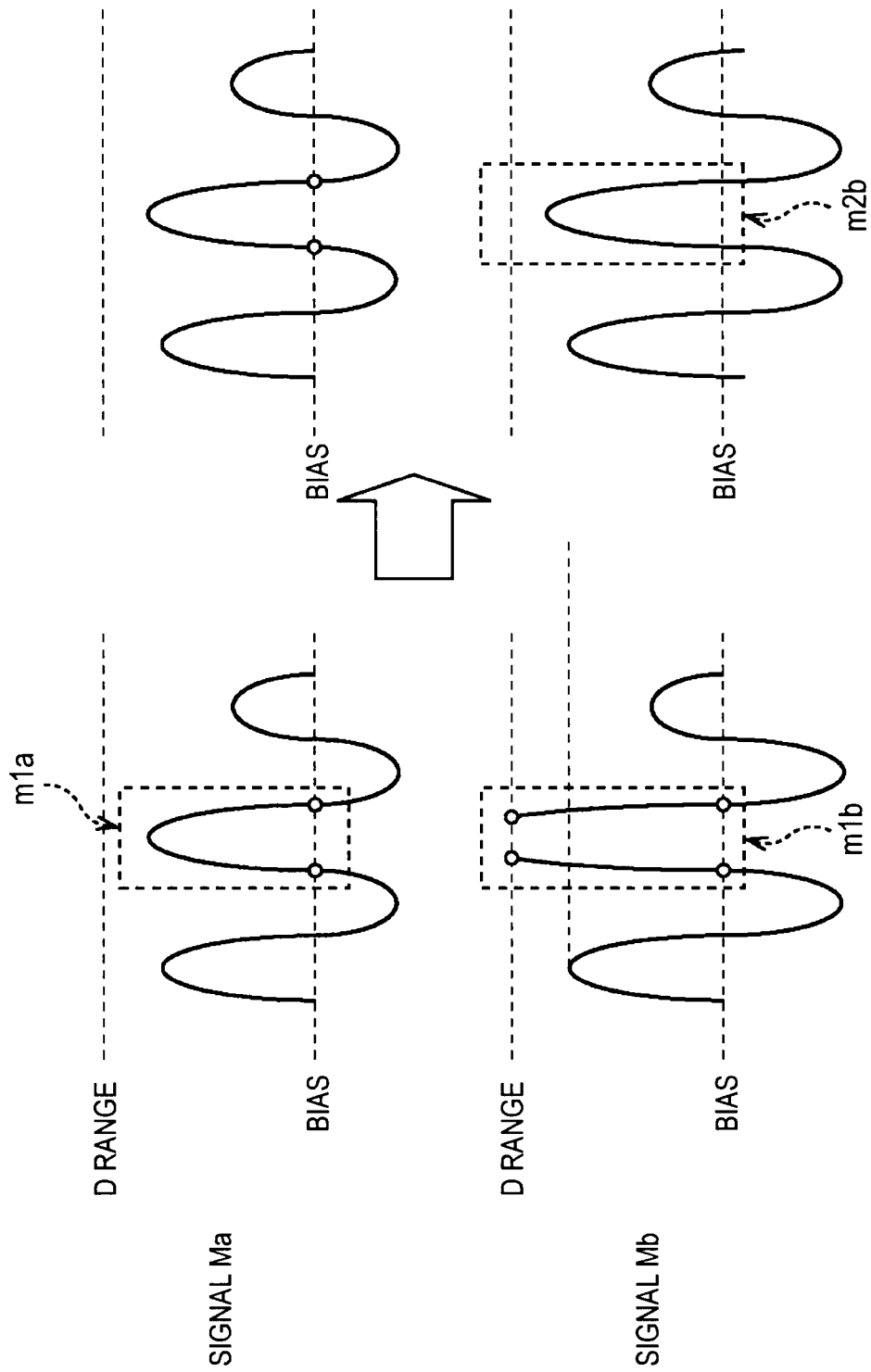
FIGS. 2A and 2B are diagrams showing the result of the waveform interpolation process of the signal processing apparatus in the example in FIG. 1.
Figure 3:
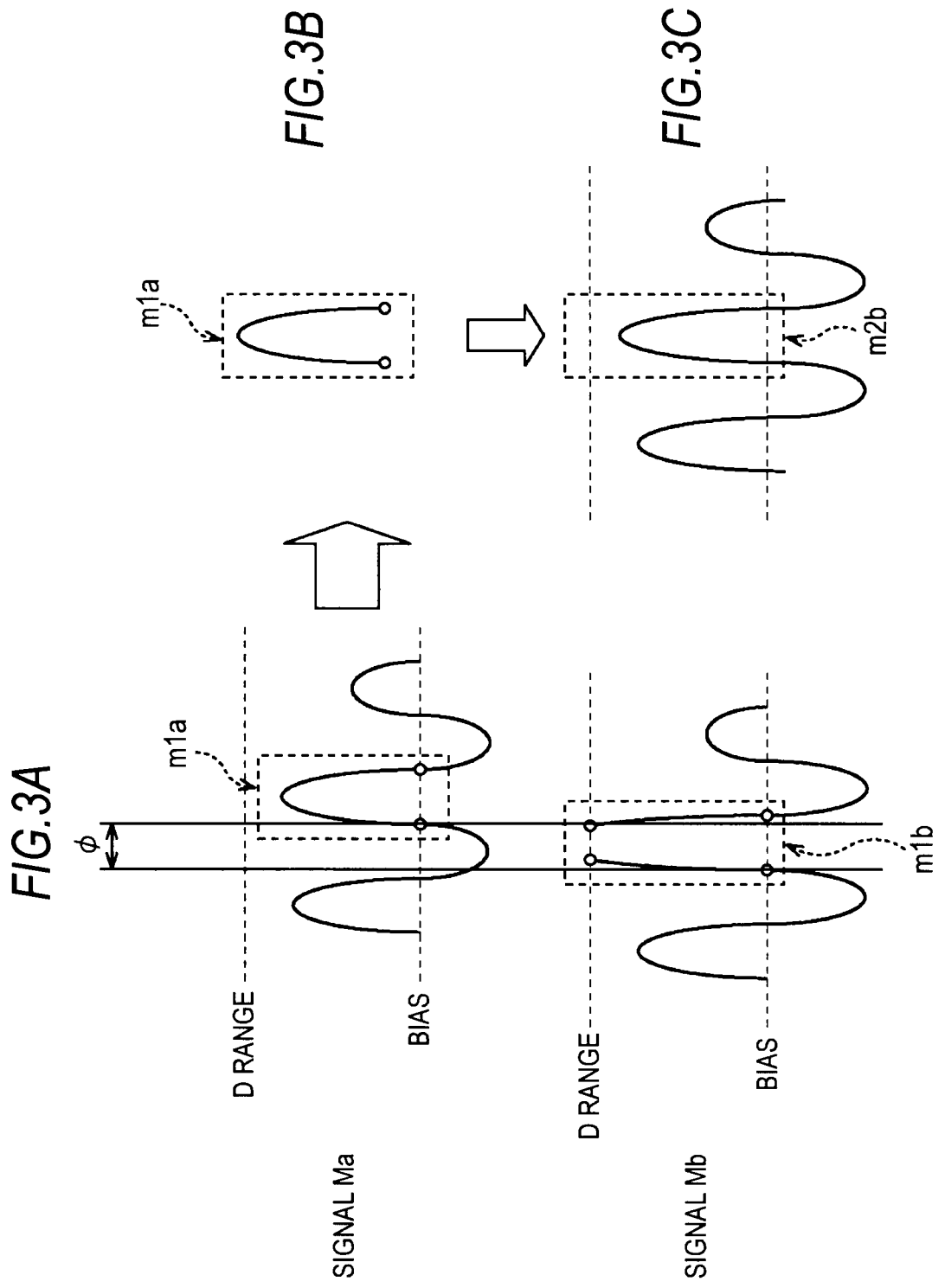
FIGS. 3A to 3C are diagrams for explaining procedures of the waveform interpolation process of the signal processing apparatus in the example in FIG. 1.

FIG. 1 is a block diagram showing a configurational example of a first embodiment of a signal processing apparatus to which the invention is applied.

The signal processing apparatus in the example in FIG. 1 performs a process of interpolating the waveform of a clipped part in audio signals Ma, Mb input from two microphones, for example, arranged close to each other. (This process will be hereinafter referred to as "waveform interpolation process".) Accordingly, the signal processing apparatus in the example in FIG. 1 is provided with two clip detectors 11-1 and 11-2, a data replacement section 12, an interpolation section 13, and a phase-difference information holder 14.

The details on the functions or the like of the individual components of the signal processing apparatus in the example in FIG. 1 will be given in the following description of the waveform interpolation process.

[Example of Waveform Interpolation Process According to First Embodiment]

Referring to FIGS. 2A to 3C as needed, one example of the waveform interpolation process of the signal processing apparatus exemplified in FIG. 1 will be described below.

FIGS. 2A and 2B are diagrams showing the result of the waveform interpolation process of the signal processing apparatus in the example in FIG. 1.

FIGS. 3A to 3C are diagrams for explaining procedures of the waveform interpolation process of the signal processing apparatus in the example in FIG. 1.

In the example, an audio signal Ma as shown in FIG. 2A is input to the clip detector 11-1, and an audio signal Mb as shown in FIG. 2A is input to the clip detector 11-2. In this case, a sequence of processes until audio signals Ma, Mb as shown in FIG. 2B are output from the signal processing apparatus in the example in FIG. 1 is the waveform interpolation process to be described below.

The clip detector 11-1 detects if a clipped part is contained in the audio signal Ma.

In this case, while the unit of detection of a clipped part is not particularly limited, it is assumed that a clipped part is detected for each partitioning signal as a unit in the embodiment. The "partitioning signal" is a signal between two zero crosses when the input signal is partitioned by a zero cross. The "zero cross" as used herein means that the signal level of the input signal crosses a reference level (hereinafter called "bias"), or means the position of a point where the signal level crosses the bias.

That is, the clip detector 11-1 detects a zero cross of the audio signal Ma, and partitions the audio signal Ma with the zero cross. As a result, a plurality of partitioning signals are acquired. In the example in FIG. 2A, for example, a partitioning signal m1$a$ is acquired.

In addition, the scheme of detecting a clipped part itself is not particularly restrictive as long as the scheme can detect an interval in which a partitioning signal exceeds the dynamic range of the circuit (shown as "D range" in the example in FIGS. 2A and 2B or the example in FIGS. 3A to 3C). In case where the audio signals Ma, Mb are formed as a digital signal, for example, it is possible to adopt a scheme of detecting that a clipped part is contained in a partitioning signal when the partitioning signal has an interval which contains "1111" or "0000" consecutively.

The clip detector 11-1 supplies the interpolation section 13 with information (hereinafter called "detection information") indicating if there is a clipped part in each partitioning signal. Because a clipped part is not present in the audio signal Ma in the example in FIG. 2A, each detection information for each partitioning signal from the clip detector 11-1 indicates absence of a clipped part.

Likewise, the clip detector 11-2 detects if a clipped part is contained in the audio signal Mb for each partitioning signal taken as a unit, and supplies detection information to the interpolation section 13.

In the example in FIG. 2B, a clipped part is present in a partitioning signal m1$b$. Therefore, detection information on the partitioning signal m1$b$ indicates presence of a clipped part. It is to be noted that each detection information on the other partitioning signals indicates absence of a clipped part.

The interpolation section 13 specifies a partitioning signal containing a clipped part as a partitioning signal to be replaced (hereinafter called "to-be-replaced target partitioning signal") based on each detection information from the clip detectors 11-1, 11-2. Further, the interpolation section 13 specifies a partitioning signal to replace the waveform of the to-be-replaced target partitioning signal (hereinafter called "replacement target partitioning signal") based on each detection information from the clip detectors 11-1, 11-2 and phase difference information held in the phase-difference information holder 14.

For example, the audio signals Ma, Mb are audio signals corresponding to sounds respectively collected by two closely located microphones. While the audio signals Ma, Mb have substantially similar waveforms, therefore, they have a phase difference according to the positional relation between the two microphones. To be more accurate, the waveforms of the audio signals Ma, Mb to be input to the signal processing apparatus in the example in FIG. 1 are waveforms having a phase difference $\phi$ as shown in FIG. 3A, not waveforms shown in FIG. 2A.

Information indicating the phase difference $\phi$ is held in the phase-difference information holder 14 as phase difference information. When the phase difference $\phi$=20 ns, for example, the value 20 ns is held as phase difference information in the phase-difference information holder 14.

In this case, the interpolation section 13 specifies the partitioning signal m1$b$ in FIG. 3A as a to-be-replaced target partitioning signal. In the specifying process, detection information from the clip detector 11-2 is used.

In addition, the interpolation section 13 specifies a partitioning signal m1$a$ in the audio signal Ma, which is shifted from the to-be-replaced target partitioning signal m1$b$ by the phase difference $\phi$=20 ns, as a replacement target partitioning signal, as shown in FIGS. 3A and 3B. It is to be noted that in the specifying process, detection information from the clip detector 11-1 and phase difference information held in the phase-difference information holder 14 are used.

The interpolation section 13 notifies the data replacement section 12 of the fact that the to-be-replaced target partitioning signal (partitioning signal m1b in the example in FIG. 3A) and the replacement target partitioning signal (partitioning signal m1a in the example in FIG. 3B) are specified. As a result, the data replacement section 12 extracts the waveform of the replacement target partitioning signal in the audio signals Ma, Mb and replaces the waveform with the waveform of the to-be-replaced target partitioning signal. The interval of the to-be-replaced target partitioning signal m1b in the audio signal Mb is replaced with the waveform of the replacement target partitioning signal m1a, as shown in the example in FIG. 3C. That is, the interval of the to-be-replaced target partitioning signal m1b is interpolated like the waveform of an interval m2b. In other words, the waveform of the interval m2b becomes an interpolated waveform.

When the foregoing sequence of processes is performed as the waveform interpolation process, the audio signals Ma, Mb shown in FIG. 2B are output from the signal processing apparatus in the example in FIG. 1.

At the time of carrying out interpolation, the replacement target partitioning signal (partitioning signal m1a in the example in FIG. 3B) may be replaced directly as exemplified in FIGS. 3A to 3C, but the replacement may be carried out after amplifying or attenuating the amplitude to the dynamic range.

The processing unit or the unit for waveform replacement is a partitioning signal in the foregoing example. Because corresponding intervals between the audio signals Ma, Mb can easily be specified based on phase difference information, however, an arbitrary interval can be the unit for waveform replacement. In this case, if a clip interval in one of the audio signals Ma, Mb is set as a to-be-replaced target interval, an interval in the other audio signal which is shifted from the to-be-replaced target interval by the phase difference can easily be set as a replacement target interval. Consequently, the waveform in the to-be-replaced target interval can easily be replaced with the waveform in the replacement target interval regardless of the unit for waveform replacement.

As apparent from the above, the interpolation process to which the invention is applied can perform interpolation using the original waveform of an input signal (waveform of replacement target partitioning signal). As a result, sounds after waveform interpolation has higher fidelity to original sounds than sounds obtained according to the related art.

There may be a case where both of partitioning signals corresponding to the matched phases of the audio signals Ma, Mb contain clipped parts (hereinafter referred to as "case where (or when) both partitioning signals are clipped"). In such a case, it is possible to adopt a scheme of interpolating the waveforms of both clipped parts according to a predetermined interpolation computation.

The interpolation computation is not particularly limited; for example, a spline interpolation scheme, a scheme using the Lagrangean function, and a scheme of acquiring an arc passing a measuring point can be adopted. It is also possible to adopt a scheme of deforming an interpolation waveform, prestored in a separate memory, according to the clip interval or the amount of compression, and a scheme of simply connecting the waveforms of clipped parts.

When both partitioning signals are clipped, the clipped parts may be left clipped without performing any interpolation scheme.

<2. Second Embodiment>

When both partitioning signals are clipped, it is also possible to adopt the following scheme. Specifically, the clipped signal waveforms are not modified, but considering the case as a situation where a signal with a large amplitude is input, an attenuator (hereinafter simply called "amplifier") is placed before the clip detector to lower the amplitude in the whole paths. This scheme is called "amplifier insertion scheme".

[Configurational Example of Second Embodiment]

Figure 4:
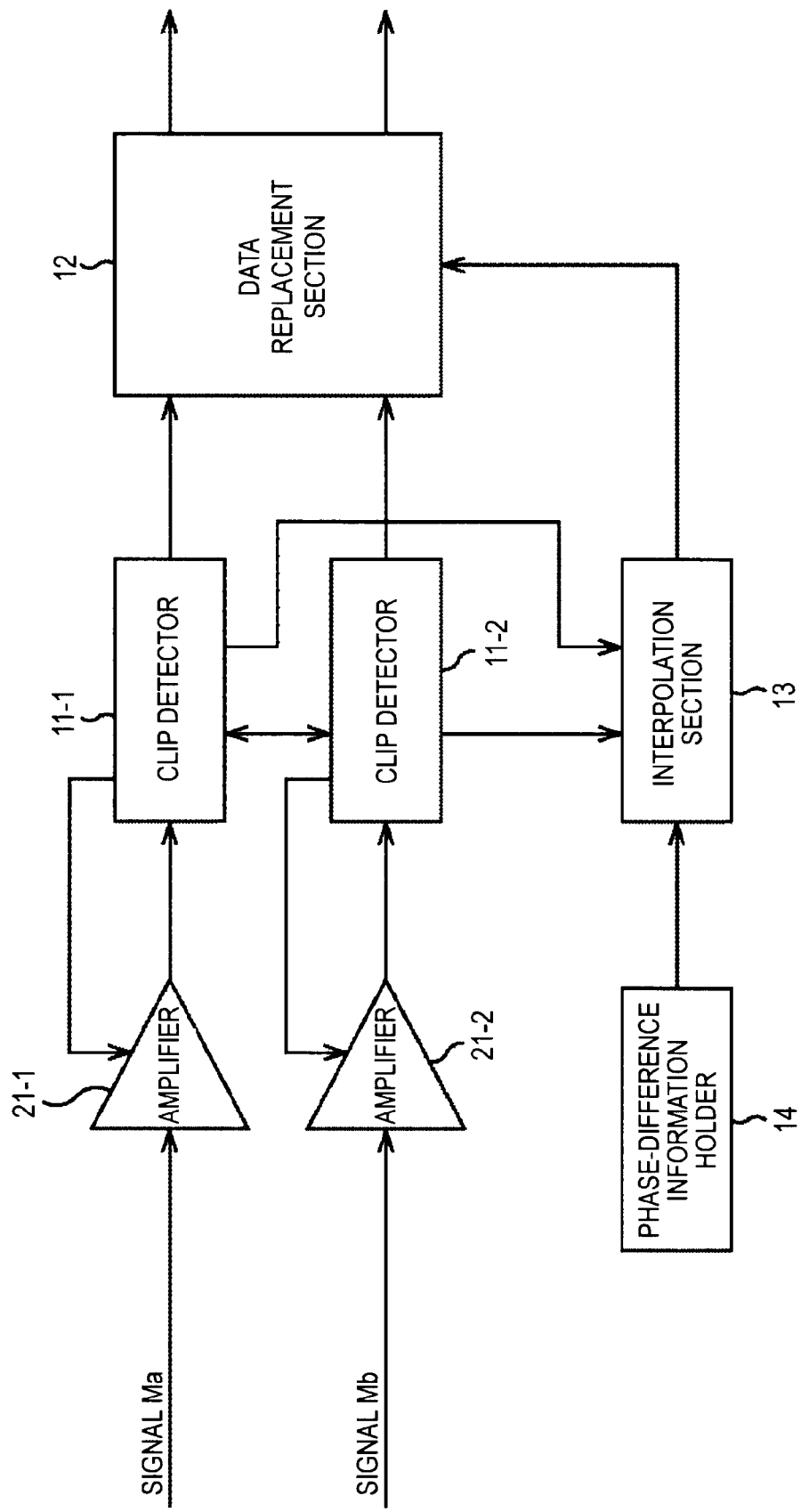
FIG. 4 is a block diagram showing a configurational example of a signal processing apparatus employing an amplifier insertion scheme as a second embodiment of the signal processing apparatus to which the invention is applied.

FIG. 4 is a block diagram showing a configurational example of a signal processing apparatus employing the amplifier insertion scheme as a second embodiment of the signal processing apparatus to which the invention is applied.

Those components in FIG. 4 which are the same as the corresponding components in FIG. 1 are given same reference numerals, and their descriptions will be omitted whenever appropriate.

The signal processing apparatus in the example in FIG. 4 is provided with an amplifier 21-1 before the clip detector 11-1, and an amplifier 21-2 before the clip detector 11-2 in addition to the configuration of the example in FIG. 1.

[Example of Waveform Interpolation Process According to Second Embodiment]

A process in the waveform interpolation process of the signal processing apparatus exemplified in FIG. 4 which is performed when both partitioning signals are not clipped is basically the same as the waveform interpolation process of the signal processing apparatus in the example in FIG. 1. In this case, the gains (amounts of attenuation) of the amplifiers 21-1, 21-2 are set constant.

When both partitioning signals are clipped, on the other hand, information indicating the case is notified to the amplifier 21-1 from the clip detector 11-1, and to the amplifier 21-2 from the clip detector 11-2. Then, the amplifiers 21-1, 21-2 increase the amounts of attenuation (reduce the gains). This reduces the possibility of clipping the waveform when a signal with a large amplitude is input next.

When both partitioning signals are clipped and the amounts of attenuation of the amplifiers 21-1, 21-2 are increased, a scheme of keeping the amounts of attenuation (gains) thereafter is not particularly limited. For example, it is possible to adopt various schemes, such as a scheme of returning the amounts of attenuation to the original amounts of attenuation after a set time elapses, a scheme of holding the current amounts of attenuation until the mode is changed, and a scheme of canceling the attenuation increase (returning the amounts of attenuation) according to the amplitude of the input signal.

<3. Third Embodiment>

The foregoing first embodiment and second embodiment have two input paths. However, the input paths are not particularly limited to two paths. Even when the input paths are three or more paths, the invention can easily be adapted merely by increasing the number of clip detectors of the signal processing apparatus by the number of the input paths. In this case, when all corresponding intervals of audio signals in the input paths are clipped, the signal processing apparatus has only to perform the process in the manner similar to those of the first and second embodiments. When there are a plurality of unclipped audio signals, the signal processing apparatus may create an interpolated waveform using the average value or weighted average value of the unclipped waveforms. Further, an uninterpolated signal path may be uniquely designated, and an interpolated waveform may be created using an audio signal input to the designated signal path.

[Configurational Example of Third Embodiment]

FIG. 5 is a block diagram showing a configurational example of a signal processing apparatus having three input paths as a third embodiment of the signal processing apparatus to which the invention is applied.

Those components in FIG. 5 which are the same as the corresponding components in FIG. 1 are given same reference numerals, and their descriptions will be omitted whenever appropriate.

The signal processing apparatus in the example in FIG. 5 is provided with a clip detector 11-3 for an additional input path in addition to the configuration of the example in FIG. 1 with two input paths.

[Example of Waveform Interpolation Process According to Third Embodiment]

Referring to FIGS. 6A to 13B as needed, one example of the waveform interpolation process of the signal processing apparatus exemplified in FIG. 5 will be described below.

FIGS. 6A and 6B are diagrams showing the result of the waveform interpolation process of the signal processing apparatus in the example in FIG. 5.

It is assumed that an audio signal Ma shown in FIG. 6A is input to the clip detector 11-1, an audio signal Mb shown in FIG. 6A is input to the clip detector 11-2, and an audio signal Mc shown in FIG. 6A is input to the clip detector 11-3. In this case, a sequence of processes until audio signals Ma, Mb as shown in FIG. 6B are output from the signal processing apparatus in the example in FIG. 5 is the waveform interpolation process to be described below.

FIG. 7 is a flowchart illustrating one example of the waveform interpolation process of the signal processing apparatus in the example in FIG. 5.

In step S1, the clip detectors 11-1 to 11-3 in the three input paths attempt to detect clipping from the audio signals Ma to Mc, respectively. The detection results are supplied as detection information to the interpolation section 13.

The unit for clip detection is not particularly limited regardless of the number of the input paths, and a clipped portion is detected with a partitioning signal as a unit as per the first embodiment. In addition, the scheme of detecting clipping is not particularly limited as described in the foregoing description of the first embodiment.

In step S2, the interpolation section 13 determines whether or not clipping is detected.

When none of the clip detectors 11-1 to 11-3 in the three input paths detect clipping, the decision in step S2 is NO, and the process is returned to step S1. That is, the loop process of step S1 and NO in step S2 is repeated until at least one of the clip detectors 11-1 to 11-3 in the three input paths detects clipping.

When at least one of the clip detectors 11-1 to 11-3 in the three input paths detects clipping thereafter, i.e., when such detection information is supplied, the decision in step S2 is YES, and the process proceeds to step S3.

In step S3, the interpolation section 13 determines whether or not clipping is detected in all the input paths (three input paths in the example).

When clipping is detected in all the input paths, the decision in step S3 is YES, and the process proceeds to step S4. In step S4, the interpolation section 13 interpolates the waveforms of all the clipped parts according to a predetermined interpolation computation. It is to be noted that where to perform waveform interpolation is not particularly limited; the waveform interpolation may be performed in the interpolation section 13 or in the data replacement section 12. In the latter case, it is possible to take an approach similar to that of the first embodiment in which the data replacement section 12 performs interpolation under control of the interpolation section 13.

The interpolation computation scheme in this case, is not particularly limited. That is, the scheme which can be adopted in the first embodiment when both partitioning signals are clipped is directly adoptable to the process of step S3.

The process of step S4 may be omitted, and the clipped parts may be left clipped without performing any interpolation scheme.

When clipping is not detected in every input path, i.e., when clipping is detected in one input path or two input paths, the decision in step S3 is NO, and the process proceeds to step S5.

In step S5, the interpolation section 13 interpolates the waveform of the clipped part using the waveform in the input path where clipping is not detected.

The process of step S5 will be hereinafter called "clip interpolation process". Specific examples of the clip interpolation process will be described later referring to FIGS. 8 to 13B.

It is to be noted that where to perform clip interpolation process is not particularly limited; the waveform interpolation process may be performed in the interpolation section 13 or in the data replacement section 12. In the latter case, it is possible to take an approach similar to that of the first embodiment in which the data replacement section 12 performs the clip interpolation process under control of the interpolation section 13.

When the clip interpolation process of step S5 or the process of step S4 is performed to interpolate the waveform of the clipped part, the process proceeds to step S6.

In step S6, the interpolation section 13 determines whether or not termination of the process is instructed.

When termination of the process has not been instructed yet, the decision in step S6 is NO, and the process is returned to step S1. That is, the loop process of step S1 to step S6 is repeated until termination of the process is instructed.

When termination of the process is instructed thereafter, the decision in step S6 is YES, and the waveform interpolation process is terminated.

The following will describe three specific examples of the clip interpolation process of step S5 in FIG. 7 referring to FIGS. 8 to 13B. Of course, the clip interpolation process can be any process of interpolating the waveform of a clipped part using the waveform in an input path where clipping is not detected, and is not limited to the following three examples.

The following description will be given of the approach taken in the first embodiment. That is, the data replacement section 12 performs the clip interpolation process under control of the interpolation section 13.

Figure 8:
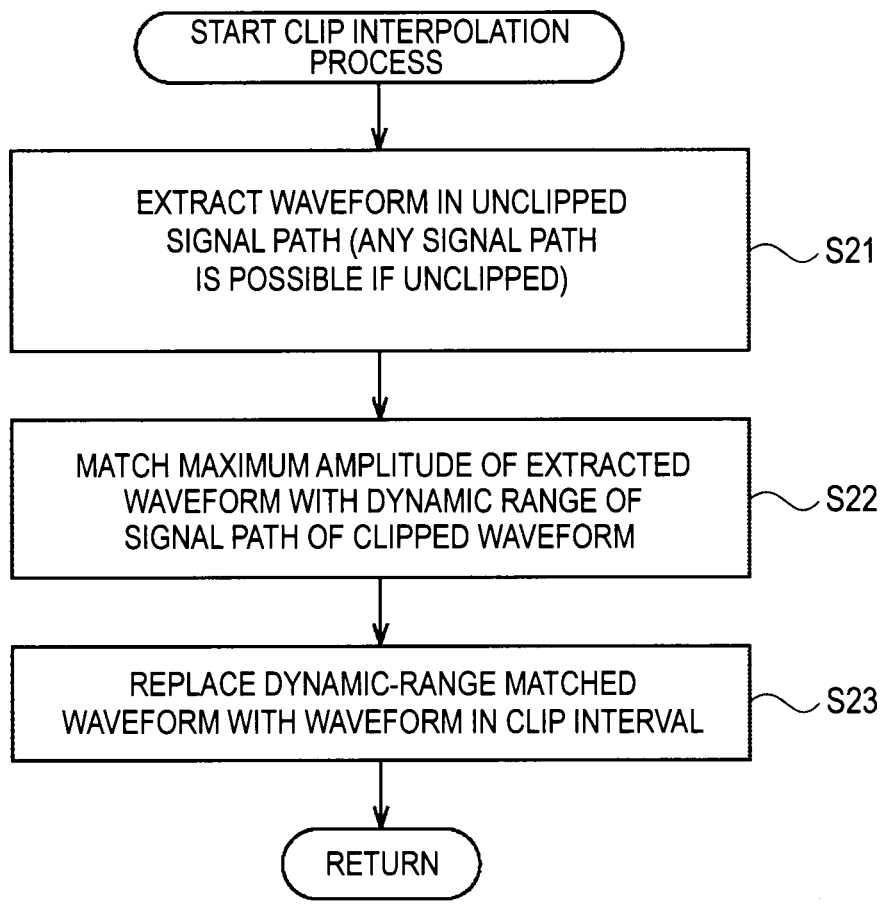
FIG. 8 is a flowchart illustrating a first example of a clip interpolation process in FIG. 5.

FIG. 8 is a flowchart illustrating a first example of the clip interpolation process.

Figure 9B:
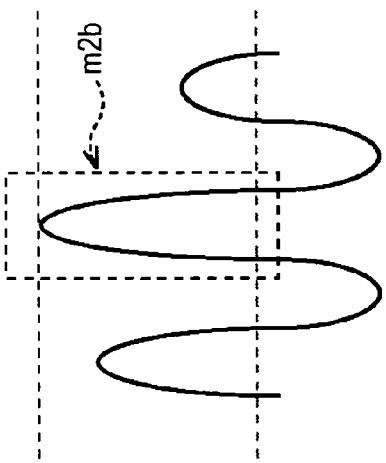
FIGS. 9A and 9B are exemplary diagrams for explaining the first example of the clip interpolation process for the example in FIGS. 6A and 6B.
Figure 9A:
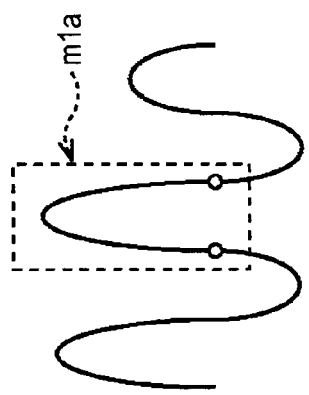

FIGS. 9A and 9B are exemplary diagrams for explaining the first example of the clip interpolation process for the example in FIGS. 6A and 6B.

In step S21 in FIG. 8, the data replacement section 12 extracts the waveform of an unclipped signal path.

In this case, the waveform may be extracted from any signal path which is not clipped.

According to the third embodiment, as described above, the unit of detection of clipping is a partitioning signal. Therefore, the waveform is likewise extracted for each partitioning signal taken as a unit.

Specifically, for example, a clipped part is present in a partitioning signal m1b in the audio signal Mb in the example in FIGS. 6A and 6B. Accordingly, the interpolation section 13 specifies the partitioning signal m1b as a to-be-replaced target partitioning signal as per the first embodiment.

For example, the audio signals Ma, Mb and Mc are audio signals corresponding to sounds collected respectively from three closely located microphones. Therefore, while the audio signals Ma, Mb, Mc have substantially the same waveforms, they have phase differences according to the positional relation of the three microphones. To be more accurate, the waveforms of the audio signals Ma, Mb, Mc to be input to the signal processing apparatus in the example in FIG. 1 are not the waveforms shown in FIG. 6A; though not illustrated, with the audio signal Mb being a reference, the audio signal Ma has a waveform having a phase difference $\phi 1$, and the audio signal Mc has a waveform having a phase difference $\phi 2$.

Information indicating the phase differences $\phi 1$, $\phi 2$ is held in the phase-difference information holder 14 as phase difference information.

In this case, the interpolation section 13 specifies a partitioning signal m1b in the audio signal Mb in FIG. 6A as a to-be-replaced target partitioning signal. It is to be noted that in the specifying process, detection information from the clip detector 11-2 is used.

In addition, as shown in FIG. 6A, the interpolation section 13 specifies a partitioning signal m1a in the audio signal Ma, which is shifted from the to-be-replaced target partitioning signal m1b by the phase difference $\phi 1$, as a replacement target partitioning signal. It is to be noted that in the specifying process, detection information from the clip detector 11-1 and phase difference information held in the phase-difference information holder 14 are used.

The interpolation section 13 notifies the data replacement section 12 of the fact that the to-be-replaced target partitioning signal (partitioning signal m1b in the example in FIG. 6A) and the replacement target partitioning signal (partitioning signal m1a in the example in FIG. 6A) are specified. As a result, the data replacement section 12 extracts the waveform of the replacement target partitioning signal m1a from the audio signal Ma as shown in FIG. 9A in step S21.

Because the audio signal Mc is not clipped either, the data replacement section 12 may extract the waveform of the partitioning signal m1c, considering the partitioning signal m1c as a replacement target partitioning signal.

In step S22, the data replacement section 12 matches the maximum amplitude of the extracted waveform with the dynamic range of the signal path of the clipped waveform. In step S23, the data replacement section 12 replaces the dynamic-range matched waveform with the waveform in the clipped interval.

In the example in FIGS. 9A and 9B, the waveform of the replacement target partitioning signal m1a is matched with the dynamic range of the signal path of the audio signal Mb in step S22. In step S23, the dynamic-range matched waveform of the replacement target partitioning signal m1a is replaced as the waveform in the interval in the to-be-replaced target partitioning signal m1b in the audio signal Mb (clipped interval). That is, the waveform in the interval (clipped interval) in the to-be-replaced target partitioning signal m1b in the audio signal Mb in FIG. 6A is interpolated like the waveform in the interval m2b as shown in FIG. 9B. In other words, the waveform in the interval m2b becomes an interpolated waveform.

In the first example of the clip interpolation process, as apparent from the above, interpolation can be performed using the original waveform of an input signal (unclipped waveform extracted in the process of step S21). As a result, sounds after waveform interpolation has higher fidelity to original sounds than sounds obtained according to the related art.

The first example of the clip interpolation process has been described above referring to FIGS. 8, 9A and 9B. Next, a second example of the clip interpolation process will be described referring to FIGS. 10, 11A and 11B.

Figure 10:
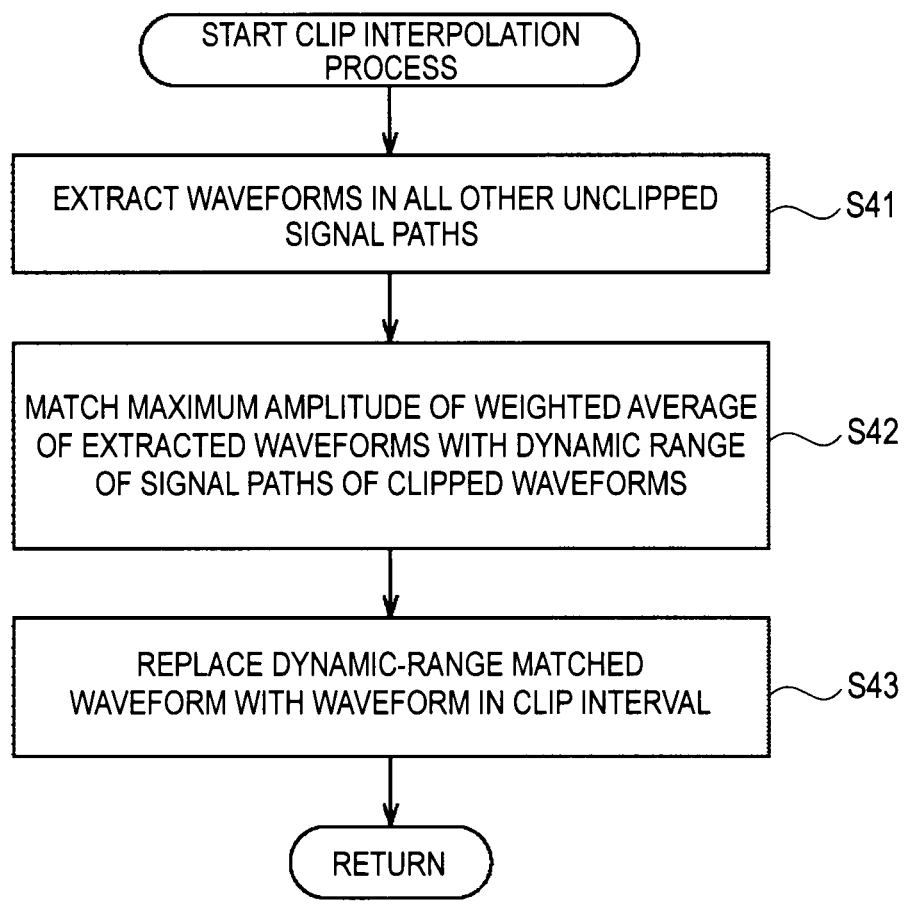
FIG. 10 is a flowchart illustrating a second example of the clip interpolation process in FIG. 5.
Figure 11:
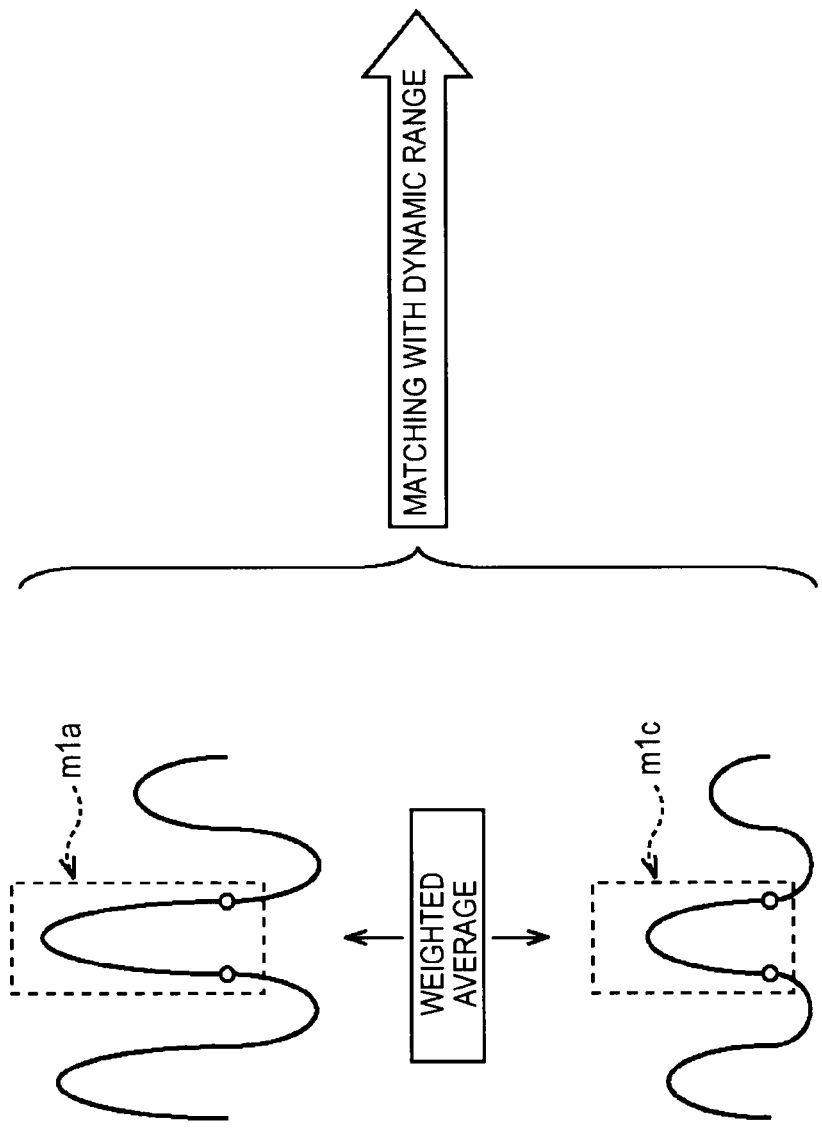
FIGS. 11A and 11B are exemplary diagrams for explaining a second example of the clip interpolation process for the example in FIGS. 6A and 6B.

FIG. 10 is a flowchart illustrating the second example of the clip interpolation process.

FIGS. 11A and 11B are exemplary diagrams for explaining the second example of the clip interpolation process for the example in FIGS. 6A and 6B.

In step S41 in FIG. 10, the data replacement section 12 extracts all the waveforms of unclipped signal paths.

Specifically, for example, a clipped part is present in a partitioning signal m1b in the audio signal Mb in the example in FIG. 6A. Accordingly, the partitioning signal m1b is specified as a to-be-replaced target partitioning signal as per the first example. In this case, one of the partitioning signal m1b in the audio signal Ma and the partitioning signal m1c in the audio signal Mc is extracted as a replacement target partitioning signal in the process of step S21 in the first example (FIG. 8), whereas both of the partitioning signal m1b in the audio signal Ma and the partitioning signal m1c in the audio signal Mc are extracted as replacement target partitioning signals in the process of step S41 in the second example.

In step S42, the data replacement section 12 matches the maximum amplitude of the weighted average of the extracted waveforms with the dynamic range of the signal path of the clipped waveform. In step S43, the data replacement section replaces the dynamic-range matched waveform with the waveform in the clipped interval.

In the example in FIGS. 11A and 11B, as shown in FIG. 11A, the weighted average of the replacement target partitioning signals m1a, m1c is acquired, and the maximum amplitude of the resultant signal is matched with the dynamic range of the signal path of the audio signal Mb in step S42. In step S43, the waveform of the dynamic-range matched signal is replaced as the waveform in the interval in the to-be-replaced target partitioning signal m1b in the audio signal Mb (clipped interval). That is, the waveform in the interval (clipped interval) in the to-be-replaced target partitioning signal m1b in the audio signal Mb in FIG. 6A is interpolated like the waveform in the interval m2b as shown in FIG. 11B. In other words, the waveform in the interval m2b becomes an interpolated waveform.

In the second example of the interpolation process, as apparent from the above, interpolation can be performed using the original waveform of an input signal (unclipped waveform extracted in the process of step S41). As a result, sounds after waveform interpolation has higher fidelity to original sounds than sounds obtained according to the related art.

The second example of the clip interpolation process has been described above referring to FIGS. 10, 11A and 11B. Next, a third example of the clip interpolation process will be described referring to FIGS. 12, 13A and 13B.

Figure 12:
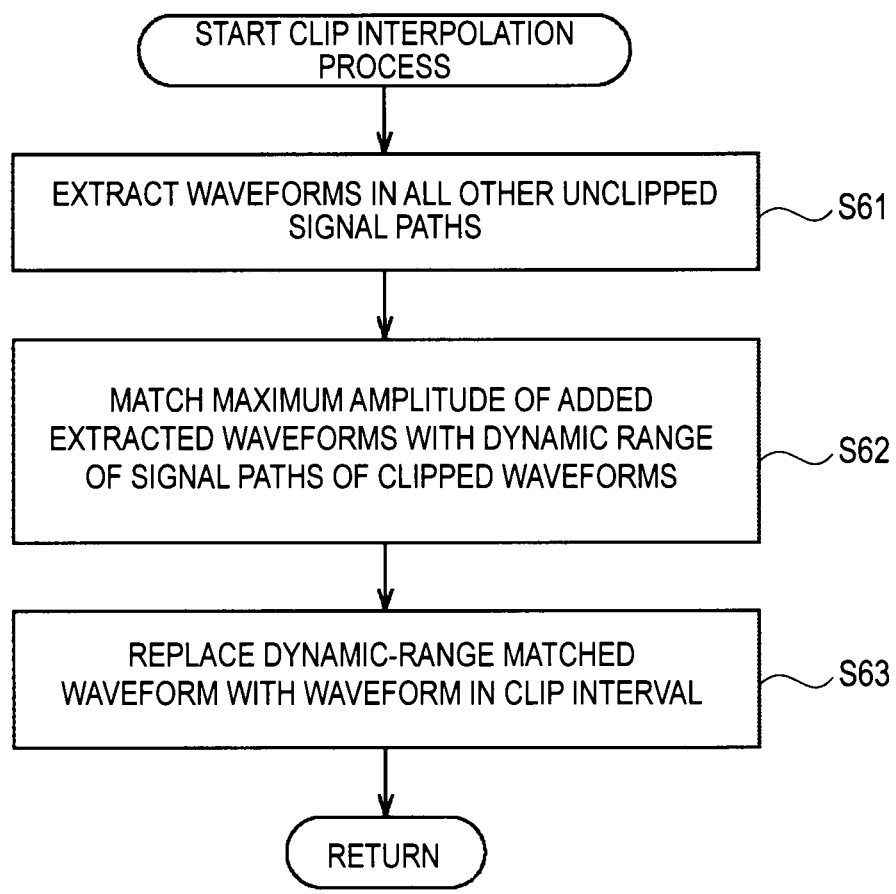
FIG. 12 is a flowchart illustrating a third example of the clip interpolation process in FIG. 5.

FIG. 12 is a flowchart illustrating the third example of the clip interpolation process.

FIGS. 13A and 13B are exemplary diagrams for explaining the third example of the clip interpolation process for the example in FIGS. 6A and 6B.

In step S61 in FIG. 12, the data replacement section 12 extracts all the waveforms of unclipped signal paths.

Specifically, for example, a clipped part is present in a partitioning signal m1b in the audio signal Mb in the example in FIG. 6A. Accordingly, the partitioning signal m1b is specified as a to-be-replaced target partitioning signal as per the first example. As in the process of step S41 in the second example (FIG. 10), both of the partitioning signal m1b in the audio signal Ma and the partitioning signal m1c in the audio signal Mc are extracted as replacement target partitioning signals in the process of step S61 in the third example.

In step S62, the data replacement section 12 matches the maximum amplitude of the extracted waveforms added together with the dynamic range of the signal path of the clipped waveform. In step S63, the data replacement section 12 replaces the dynamic-range matched waveform with the waveform in the clipped interval.

In the example in FIGS. 13A and 13B, as shown in FIG. 13A, the replacement target partitioning signals m1a, m1c are added, and the maximum amplitude of the resultant signal is matched with the dynamic range of the signal path of the audio signal Mb in step S62. In step S63, the waveform of the dynamic-range matched signal is replaced as the waveform in the interval in the to-be-replaced target partitioning signal m1b in the audio signal Mb (clipped interval). That is, the waveform in the interval (clipped interval) in the to-be-replaced target partitioning signal m1b in the audio signal Mb in FIG. 6A is interpolated like the waveform in the interval m2b as shown in FIG. 13B. In other words, the waveform in the interval m2b becomes an interpolated waveform.

In the third example of the interpolation process, as apparent from the above, interpolation can be performed using the original waveform of an input signal (unclipped waveform extracted in the process of step S61). As a result, sounds after waveform interpolation has higher fidelity to original sounds than sounds obtained according to the related art.

<4. Fourth Embodiment>

According to the first to third embodiments described above, phase difference information of the audio signal Ma, Mb, Mc in each input path is held as known information in the phase-difference information holder 14. According to the fourth embodiment, by way of contrast, phase difference information is detected by actually using the audio signal Ma, Mb, Mc in each input path.

[Configurational Example of Fourth Embodiment]

Figure 14:
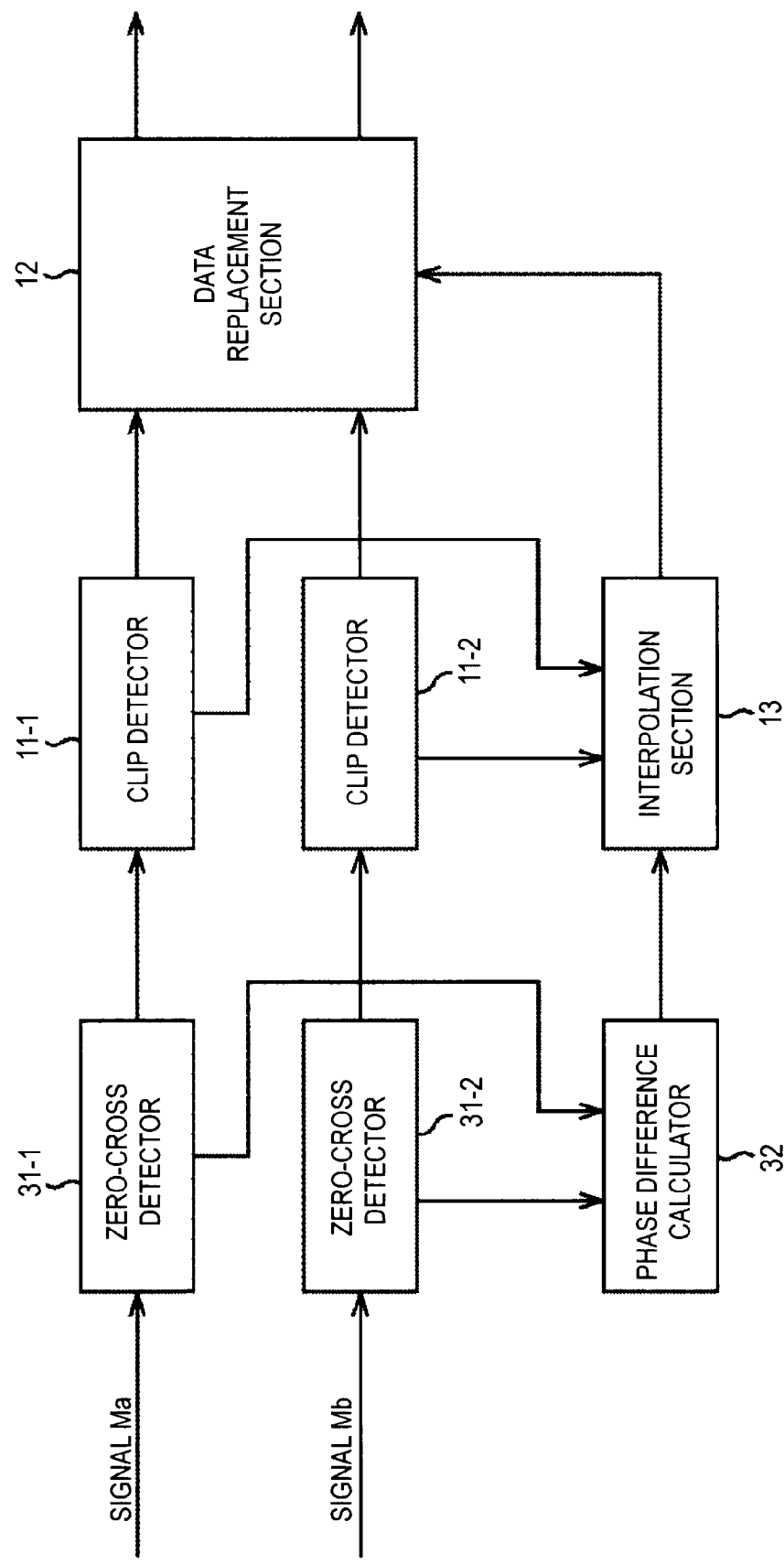
FIG. 14 is a block diagram showing a configurational example of a signal processing apparatus having two input paths as a fourth embodiment of the signal processing apparatus to which the invention is applied.

FIG. 14 is a block diagram showing a configurational example of a signal processing apparatus employing having two input paths as the fourth embodiment of the signal processing apparatus to which the invention is applied.

Those components in FIG. 14 which are the same as the corresponding components in FIG. 1 are given same reference numerals, and their descriptions will be omitted whenever appropriate.

The signal processing apparatus in the example in FIG. 14 is provided with a zero-cross detector 31-1 before the clip detector 11-1, and a zero-cross detector 31-2 before the clip detector 11-2 in addition to the configuration of the example in FIG. 1. The signal processing apparatus in the example in FIG. 14 is further provided with a phase difference calculator 32 in place of the phase-difference information holder 14 in the example in FIG. 1.

The zero-cross detectors 31-1, 31-2 have functions basically similar to the zero-cross detecting functions of the clip detectors 11-1, 11-2 according to the first to third embodiments. In other words, the zero-cross detectors 31-1, 31-2 are blocks to which the zero-cross detecting functions of the clip detectors 11-1, 11-2 according to the first to third embodiments are respectively devolved. Therefore, the zero-cross detectors 31-1, 31-2 may be omitted unless the zero-cross detecting functions of the clip detectors 11-1, 11-2 according to the first to third embodiments are devolved.

The example in FIG. 14 adopts the phase difference calculator 32 in place of the phase-difference information holder 14 in the first embodiment. However, the use of the phase difference calculator 32 is not limited to the example in FIG. 14, and the phase difference calculator 32 may be adopted in place of the phase-difference information holder 14 in the second embodiment or the third embodiment.

[Example of Waveform Interpolation Process According to Fourth Embodiment]

The zero-cross detectors 31-1, 31-2 detect a zero cross from the audio signals Ma, Mb, and supply the detection result to the phase difference calculator 32. The audio signals Ma, Mb are divided into partitioning signals by the zero cross. That is, the audio signals Ma, Mb are respectively supplied to the clip detectors 11-1, 11-2 with the partitioning signal being a unit.

The phase difference calculator 32 calculates a difference between times of detecting zero crosses by means of the zero-cross detectors 31-1, 31-2 to calculate a phase difference $\phi$. The calculated phase difference $\phi$ is supplied to the interpolation section 13.

Because the other portions of the waveform interpolation process are basically the same as those of the waveform interpolation process according to the first embodiment, their descriptions will be omitted.

<5. Fifth Embodiment>

The signal processing apparatus to which the invention is applied can be worked out in various modes including the first to fourth embodiments, and can be adopted in a sound recording apparatus.

[Configurational Example of Fifth Embodiment]

Figure 15:
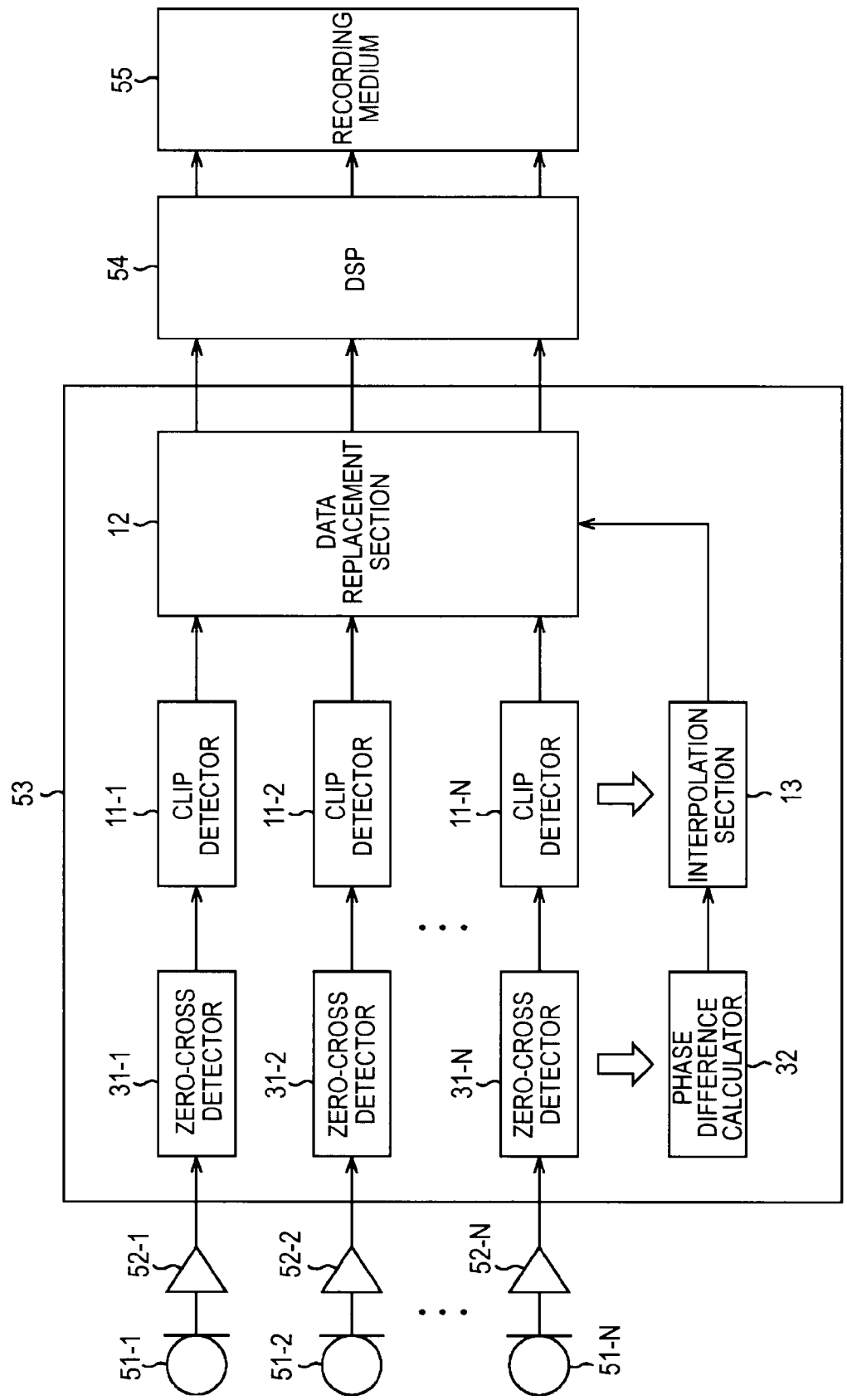
FIG. 15 is a block diagram showing a configurational example of a signal processing apparatus having N input paths (N being an integer equal to or greater than 2) as a fifth embodiment of the signal processing apparatus to which the invention is applied.

FIG. 15 is a block diagram showing a configurational example of a signal processing apparatus having N input paths (N being an integer equal to or greater than 2) as a fifth embodiment of the signal processing apparatus to which the invention is applied.

In the example in FIG. 15, a signal processing apparatus 53 according to the fifth embodiment is provided as one component of a sound recording apparatus. Accordingly, other components of the sound recording apparatus are also shown in FIG. 15. In other words, FIG. 15 shows a configurational example of the sound recording apparatus in which the signal processing apparatus 53 according to the fifth embodiment is provided.

Those components in FIG. 15 which are the same as the corresponding components in FIG. 14 are given same reference numerals, and their descriptions will be omitted whenever appropriate.

The signal processing apparatus 53 in the example in FIG. 15 is provided with zero-cross detectors 31-3 to 31-N and clip detectors 11-3 to 11-N for (N−2) input paths in addition to the configuration of the example in FIG. 14 which has two input paths. It is to be noted that the zero-cross detector 31-3 and the clip detector 11-3 are not shown.

In the sound recording apparatus in the example in FIG. 15, microphones 51-1 to 51-N and amplifiers 52-1 to 52-N are provided before the signal processing apparatus 53, i.e., at the N input paths of the signal processing apparatus 53, respectively. A DSP (Digital Signal Processor) 54 is provided after the signal processing apparatus 53.

[Process Example of Recording/Reproducing Apparatus Having Signal Processing Apparatus According to Fifth Embodiment]

The microphones 51-1 to 51-N convert external sounds to audio signals, and supply the audio signals to the amplifiers 52-1 to 52-N, respectively.

Each of the amplifiers 52-1 to 52-N amplifies the audio signal by a predetermined gain, and supplies the amplified audio signal to the signal processing apparatus 53 according to the fifth embodiment.

While the gains of the amplifiers 52-1 to 52-N may be set to the same value, the gains are set to different values according to the present embodiment. If the gains are set to the same value, when large-amplitude sounds are input to the respective microphones 51-1 to 51-N, sound cracking occurs in all of the N input paths. That is, clipping occurs in the audio signals in all the N input paths. The values of the gains are made different from one another to avoid such clipping. From the viewpoint of avoiding occurrence of clipping in the audio signals in all the N input paths, at least one of the values of the gains of the amplifiers 52-1 to 52-N may be set different from the values of the other gains.

In the signal processing apparatus according to the fifth embodiment, the phase difference calculator 32 calculates phase differences among the audio signals in the N input paths based on the detection results from the zero-cross detectors 31-1 to 31-N. The same phase difference calculation scheme as used in the fourth embodiment can be adopted in the fifth embodiment.

The clip detectors 11-1 to 11-N, the data replacement section 12 and the interpolation section 13 perform the waveform interpolation process to which the invention is applied. A waveform interpolation process similar to the one performed in the first embodiment is performed when N=2, whereas a waveform interpolation process similar to the one performed in the third embodiment is performed when $N \geqq 3$.

The waveforms of the audio signals input from the respective N input paths are output to N output paths of the signal processing apparatus 53 according to the fifth embodiment after interpolation of any waveform, if clipped, in its clip interval, in the above manner, and are then supplied to the DSP 54.

The DSP 54 performs a necessary process, such as decoding, on the individual audio signals supplied from the N output paths of the signal processing apparatus 53 according to the fifth embodiment as needed, and records the result signals in a recording medium 55.

Because any of the audio signals recorded in the recording medium 55 has been interpolated using the original waveform (unclipped waveform in another path) by the signal processing apparatus 53 according to the fifth embodiment, the audio signals are closer to original audio signals with fewer information to be lost. That is, when audio signals recorded in the recording medium 55 are reproduced, sounds output from a speaker or the like have higher fidelity to the original sounds than sounds obtained according to the related art. When the microphones 51-1 to 51-N are omnidirectional microphones arranged close to one another, particularly, the waveforms of the individual audio signals in the N input paths of the signal processing apparatus 53 according to the fifth embodiment extremely resemble to one another, thus allowing sounds with higher fidelity to original sounds to be output.

[Application of the Invention to Program]

The foregoing sequence of processes can be performed by either hardware or software. In case of performing the sequence of processes by software, a program realizing the software is installed from a program recording medium. This program is installed into, for example, a computer installed in dedicated hardware. Alternatively, the program is installed in, for example, a general-purpose personal computer which can execute various functions as various respective programs are installed therein.

Figure 16:
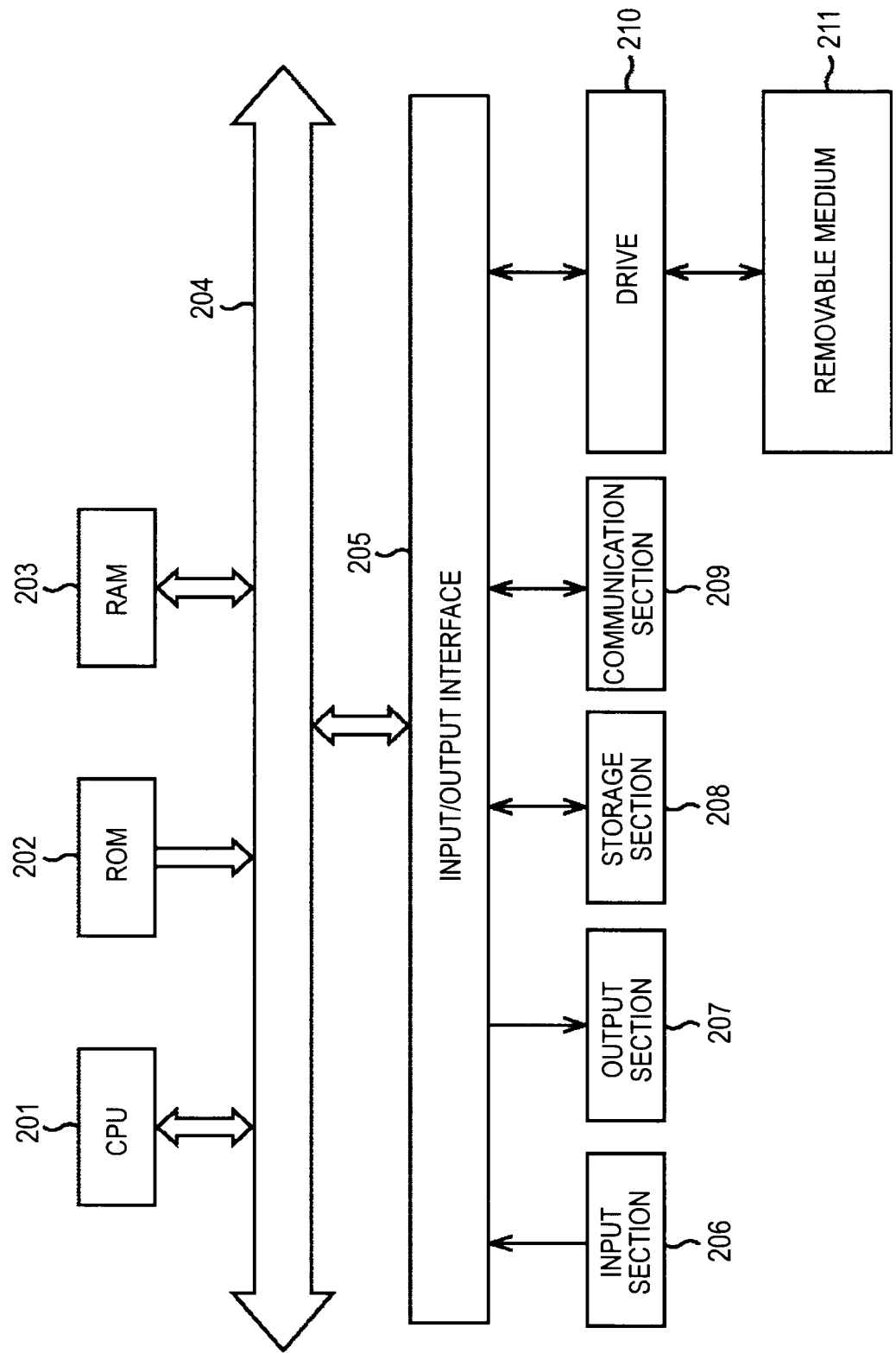
FIG. 16 is a block diagram showing a configurational example of the hardware of a computer which executes a program to which the invention is applied.

FIG. 16 is a block diagram showing a configurational example of the hardware of a computer which performs the foregoing sequence of processes based on a program.

CPU (Central Processing Unit) 201, ROM (Read Only Memory) 202, and RAM (Random Access Memory) 203 are connected together by a bus 204. The bus 204 is further connected with an input/output interface 205. The input/output interface 205 is connected with an input section 206 including a keyboard, a mouse, and a microphone, an output section 207 including a display, and a speaker, and a storage section 208 including a hard disk, and a non-volatile memory. Further, the input/output interface 205 is connected with a communication section 209 including a network interface, and a drive 210 which drives a removable medium 211, such as a magnetic disk, an optical disc, a magneto-optical disc, or a semiconductor memory.

In the computer with the foregoing configuration, the CPU 201 loads a program stored in, for example, the storage section 208, into the RAM 203 via the input/output interface 205 and the bus 204, and executes the program to perform the foregoing sequence of processes. The program that is executed by the computer (CPU 201) is provided in the form of being recorded in the removable medium 211 which is, for example, a magnetic disk (including a flexible disk). The program to be provided is recorded in the removable medium 211 as a package medium. Available package mediums include an optical disc (CD-ROM (Compact Disc-Read Only Memory), DVD (Digital Versatile Disc), or the like), a magneto-optical disc, and a semiconductor memory. The program may be provided via a cabled or wireless transfer medium, such as a local area network, Internet or digital satellite broadcasting. The program can be installed into the storage section 208 via the input/output interface 205 by mounting the removable medium 211 into the drive 210. The program can be received at the communication section 209 via a cabled or wireless transfer medium to be installed into the storage section 208. In addition, the program can be preinstalled in the ROM 202 or the storage section 208.

The program that is executed by the computer may be a program which performs a sequence of processes time-sequentially in the order explained herein, or a program which performs a sequence of processes in parallel or at necessary timings, such as whenever invoked.

The foregoing embodiments of the present invention are not restrictive, and the invention may be modified in various other forms without departing from the scope of the invention.

The present application contains subject matter related to that disclosed in Japanese Priority Patent Application JP 2009-089748 filed in the Japan Patent Office on Apr. 2, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing apparatus comprising:
 a clip detector that detects a presence of a clipped part having a deformed waveform in each of two or more audio signals output from two or more microphones based on a dynamic range of a circuit; and
 an interpolator that
  selects an audio signal from one of the two or more audio signals which has the clipped part detected by the clip detector as an interpolation target,
  selects other audio signals different than the interpolation target as non-interpolation targets, and
  interpolates the deformed waveform of the clipped part of the interpolation target using waveforms of at least one audio signal in the non-interpolation targets by matching a maximum amplitude of a weighted average of the waveforms of the at least one audio signal in the non-interpolation targets with the dynamic range of the circuit.

2. The signal processing apparatus according to claim 1, wherein the interpolator
matches a phase of one or more of the non-interpolation targets to be used in interpolation with a phase of the interpolation target, and
interpolates the clipped part of the interpolation target using a waveform in an interval of each of the non-interpolation targets to be used in interpolation, the waveform corresponding to the clipped part of the interpolation target.

3. The signal processing apparatus according to claim 1, further comprising:
an amplifier/attenuator that amplifies or attenuates the two or more audio signals output from the two or more microphones by two or more predetermined gains, wherein at least one of the two or more predetermined gains is different from the other predetermined gains.

4. The signal processing apparatus according to claim 1, wherein
the two or more microphones includes at least three microphones, and
the interpolator interpolates a waveform of the clipped part of the interpolation target using waveforms of the non-interpolation targets.

5. An information processing method comprising:
detecting a presence of a clipped part having a deformed waveform in each of two or more audio signals output from two or more microphones based on a dynamic range of a circuit;
selecting an audio signal from one of the two or more audio signals which has the clipped part detected as an interpolation target;
selecting the other audio signals different than the interpolation target as non-interpolation targets; and
interpolating the deformed waveform of the clipped part of the interpolation target using waveforms of at least one audio signal in the non-interpolation targets by matching a maximum amplitude of a weighted average of the waveforms of the at least one audio signal in the non-interpolation targets with the dynamic range of the circuit.

6. A non-transitory computer readable medium having computer readable instructions thereon that when executed by a computer cause the computer to perform a signal processing method comprising:
detecting a presence of a clipped part having a deformed waveform in each of two or more audio signals output from two or more microphones based on a dynamic range of a circuit;
selecting an audio signal from one of the two or more audio signals which has the clipped part detected as an interpolation target;
selecting the other audio signals different than the interpolation target as non-interpolation targets; and
interpolating the deformed waveform of the clipped part of the interpolation target using waveforms of at least one audio signal in the non-interpolation targets by matching a maximum amplitude of a weighted average of the waveforms of the at least one audio signal in the non-interpolation targets with the dynamic range of the circuit.

7. The signal processing apparatus according to claim 2, wherein the interpolator detects the phase of the one or more of the non-interpolation targets and the phase of the interpolation target based on one or more detected zero-crossings.

8. The signal processing apparatus according to claim 1, wherein the interpolator matches a maximum amplitude of the waveform of each of the non-interpolation targets with the dynamic range of the circuit.

9. The signal processing apparatus according to claim 1, wherein the interpolator matches a maximum amplitude of the sum of the waveforms of the non-interpolation targets with the dynamic range of the circuit.

10. The signal processing apparatus of claim 1 further comprising:
a recorder that records the audio signals in the non-interpolation targets and the output of the interpolator.

11. The signal processing apparatus of claim 7 further comprising:
a recorder that records the audio signals in the non-interpolation targets and the output of the interpolator; and
an amplifier/attenuator that amplifies or attenuates the two or more audio signals output from the two or more microphones by two or more predetermined gains, wherein at least one of the two or more predetermined gains is different from the other predetermined gains.

* * * * *